(12) United States Patent
Seigler et al.

(10) Patent No.: US 6,798,623 B2
(45) Date of Patent: Sep. 28, 2004

(54) BIASED CPP SENSOR USING SPIN-MOMENTUM TRANSFER

(75) Inventors: Michael Allen Seigler, Pittsburgh, PA (US); Petrus Antonius Van der Heijden, Cranberry Township, PA (US)

(73) Assignee: Seagate Technology LLC, Scotts Valley, CA (US)

(*) Notice: Subject to any disclaimer, the term of this patent is extended or adjusted under 35 U.S.C. 154(b) by 91 days.

(21) Appl. No.: 09/683,191

(22) Filed: Nov. 29, 2001

(65) Prior Publication Data

US 2003/0206380 A1 Nov. 6, 2003

Related U.S. Application Data

(60) Provisional application No. 60/267,297, filed on Feb. 8, 2001.

(51) Int. Cl.⁷ .............................. G11B 5/127; G11B 5/39
(52) U.S. Cl. ....................................................... 360/324
(58) Field of Search ............................ 360/324, 324.1, 360/324.11, 324.12, 324.2

(56) References Cited

U.S. PATENT DOCUMENTS

| | | | |
|---|---|---|---|
| 5,523,898 A | 6/1996 | Jove et al. ................... 360/66 |
| 5,668,688 A | 9/1997 | Dykes et al. ............ 360/324.1 |
| 5,784,224 A | 7/1998 | Rottmayer et al. ......... 360/324 |
| 5,856,891 A * | 1/1999 | Ngo ............................ 360/66 |
| 5,880,912 A | 3/1999 | Rottmayer ................... 360/324 |
| 5,883,763 A | 3/1999 | Yuan et al. .................. 360/324 |
| 5,969,523 A | 10/1999 | Chung et al. ................ 324/252 |
| 5,969,910 A * | 10/1999 | Imagawa et al. ........... 360/319 |
| 6,025,979 A | 2/2000 | Yamane et al. .......... 360/324.1 |
| 6,067,200 A * | 5/2000 | Ohba et al. ................... 360/66 |
| 6,272,036 B1 | 8/2001 | You et al. ..................... 365/97 |
| 6,278,589 B1 | 8/2001 | Gill ............................. 360/314 |
| 6,341,046 B1 * | 1/2002 | Peterson ...................... 360/67 |
| 6,556,388 B1 * | 4/2003 | Everitt et al. ............... 366/314 |

* cited by examiner

Primary Examiner—Julie Anne Watko
(74) Attorney, Agent, or Firm—Buchanan Ingersoll PC; Dennis M. Carleton

(57) ABSTRACT

Disclosed is a magnetoresistive magnetic field sensor wherein the sense current flows perpendicular to the plane of the layers of the sensor. The sensor is biased into a linear operating region of the transfer curve using the sense current or a permanent magnet in conjunction with the sense current.

40 Claims, 6 Drawing Sheets

BIASED CPP SENSOR USING SPIN-MOMENTUM TRANSFER

RELATED APPLICATIONS

Referenced-applications

This application claims the benefit of U.S. Provisional Application Serial No. 60/267,297 filed on Feb. 28, 2001.

FIELD OF THE INVENTION

This invention involves the reading of magnetically recorded data and, specifically, deals with new designs for magnetic sensors which can act as magnetic read heads utilizing the giant magneto-resistance effect.

BACKGROUND OF INVENTION

Devices utilizing the giant magneto-resistance (GMR) effect have utility as magnetic sensors, especially as read sensors in read heads used in magnetic disc storage systems. The GMR effect is observed in thin, electrically conductive multi-layer systems having multiple magnetic layers. One sensor type that utilizes the GMR effect is the GMR multilayer. The GMR multilayer typically comprise a series of bi-layer devices, each of which comprise a thin sheet of a ferromagnetic material and a thin sheet of a non-magnetic material. The bi-layers are stacked to form a multi-layer device. The multi-layer device is usually mounted in the read head so that the magnetic axis of the ferromagnetic layers are transverse to the direction of rotation of the disc and parallel to the plane of the disc.

In operation, a sense current is caused to flow through the read head and therefore through the sensor. The magnetic flux from the disc causes a rotation of the magnetization vector in at least one of the sheets, which in turn causes a change in the overall resistance of the sensor. As the resistance of the sensor changes, the voltage across the sensor changes, thereby producing an output voltage.

The output voltage produced by the sensor is affected by various characteristics of the sensor. The sense current can flow through the sensor in a direction that is parallel to the planes of the layers or stacked strips. This is known as a current-in-plane or CIP configuration. Alternatively, the sense current can flow through the sensor in a direction that is perpendicular to the planes of the layers or stacked strips that comprise the sensor. This configuration is known as a current-perpendicular-to-plane component or CPP.

The types of sensors commonly in use today for magnetic read heads for a magnetic disc can be categorized as Current-In-Plane (CIP) sensors. Such a sensor is shown schematically in FIG. 1. In FIG. 1, the current is represented by arrow 8 and is shown flowing parallel to layers 9 of the sensor.

CPP sensors are known but are not commonly used for the reading of data from a magnetic disc. A CPP sensor is shown schematically in FIG. 2, wherein the current is represented by arrow 8 and is shown flowing perpendicular to layers 9.

The CPP sensor is interesting because of its potentially larger giant magneto-resistance (GMR) or change in resistance when a magnetic field is applied. The CPP sensor is therefore capable of producing a higher output voltage than the CIP sensor, which results in a more precise and sensitive read head. The larger change in resistance comes about because all of the current needs to pass through every ferromagnetic/non-magnetic/ferromagnetic (FM/NM/FM) series of interfaces and none of the current is shunted around the interfaces. Because every film and interface leads to additional resistance, it is desirable to have all of the layers and interfaces contribute to the overall $\Delta R$ of the device.

One example of a CPP sensor is a GMR multi-layer, which consists of a series of FM/NM bi-layers, as shown in FIG. 2. Every series of interfaces is an opportunity for interfacial spin-dependent scattering and every FM material is a opportunity for bulk spin-dependent bulk.

An example of a transfer curve from a CPP GMR multi-layer made of 20 bi-layers of (Cu 18 Å\CoFe 10 Å) is shown FIG. 3. In the quiescent state, the magnetization of adjacent layers in this sample are oriented 180° with respect to each other, due to RKKY coupling, as is well known in the art. The thickness of the Cu layers was chosen such that the coupling between the CoFe layers would be anti-ferromagnetic (AFM).

It can be seen from FIG. 3 that if this type of sensor is to be used in a magnetic read head, it will be necessary to bias the sensor such that it operates in a linear region, such as the regions denoted by reference numbers 1 and 2 in FIG. 3. This will be necessary if detection schemes that depend on linearity are to be used.

It is critical that the GMR multi-layer sensor be biased properly in its linear region of operation. If the sensor is either over or under biased, the signal will become non-linear and create a loss of amplitude, signal asymmetry, detection problems and tracking problems.

One way of biasing a GMR multi-layer sensor is to place a permanent magnet (PM) nearby, such that the magnetizations of adjacent FM layers are oriented 90° with respect to each other. This would be similar to applying a DC magnetic field of ~500 Oe to the sensor whose transfer curve is shown in shown in FIG. 3. The sensor could then be used to sense the field from a magnetic recording media.

One possible CPP read head design using a permanent magnet to bias the sensor into the linear operating region is shown schematically in FIG. 4. This design uses a permanent magnet and uses the shields as the current carrying leads.

One problem with this configuration is that the positioning of the permanent magnet to properly bias the GMR layer is not a trivial task. It may be critical to control the spacing between the GMR multi-layer and the permanent magnet and to center the GMR multi-layer between the ends of the permanent magnet.

When building the read head, the actual bias point cannot be determined exactly until after the read head is almost completely built. If the bias point is not correct and there is no way of adjusting the bias, the head will need to be scrapped and all of the previous processing will have been wasted.

To avoid expensive manufacturing costs associated with the positioning of the permanent magnet and to avoid scrapping a high percentage of the sensors due to inability to properly bias them, it would be desirable to have a way to adjust the biasing on the sensor such that it operates in a linear region of the transfer curve.

SUMMARY OF INVENTION

This invention describes an effective way of biasing the GMR multi-layer using the sense current. This biasing may be able to be used in lieu of a permanent magnet, such that the bias is adjustable, which would greatly simplify the sensor manufacturing process, or it may be used in conjunction with a permanent magnet to "fine tune" the biasing provided by the permanent magnet.

In this invention, the sense current will be used to induce spin-momentum transfer from one FM layer to the next FM layer to cause the magnetization of these layers to align 90° with respect to each other, thereby providing the proper biasing of the sensor.

DETAILED DESCRIPTION

Many theories and experiments have shown that spin-momentum can be transferred from one magnetic layer to another. The electrons leaving a FM layer will have their spins polarized to a certain degree depending on the FM material. If these spins then encounter a second FM layer before their spins relax, the second FM layer will exert a torque on the spins in an attempt to align them with the magnetization orientation of the first FM layer. According to Newton's law, the electrons must exert an equal and opposite torque on the magnetization of the second FM layer. If the volume of the second FM layer is small, this torque can dominate over other intrinsic and extrinsic torques on the moment, allowing the torque exerted from the electrons to change the magnetization of the second FM layer. If the orientation of the first magnetic layer and the current density is chosen correctly, this effect causes the magnetic moments of each layer of a GMR multi-layer to align 90° with respect to each other, as is needed for proper biasing of the multi-layer.

Figure 1:
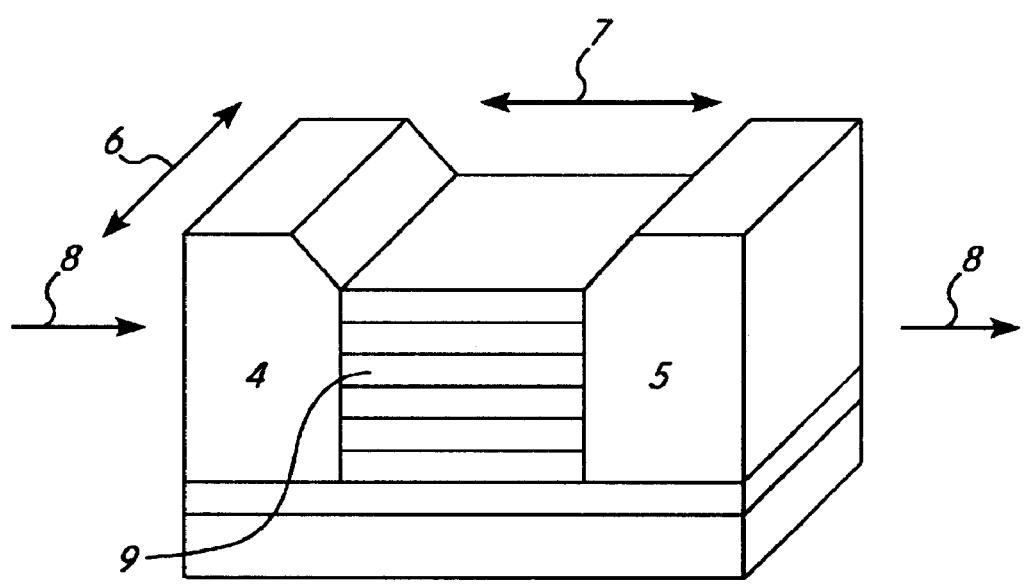
FIG. 1 shows a prior art CIP type sensor.
Figure 2:
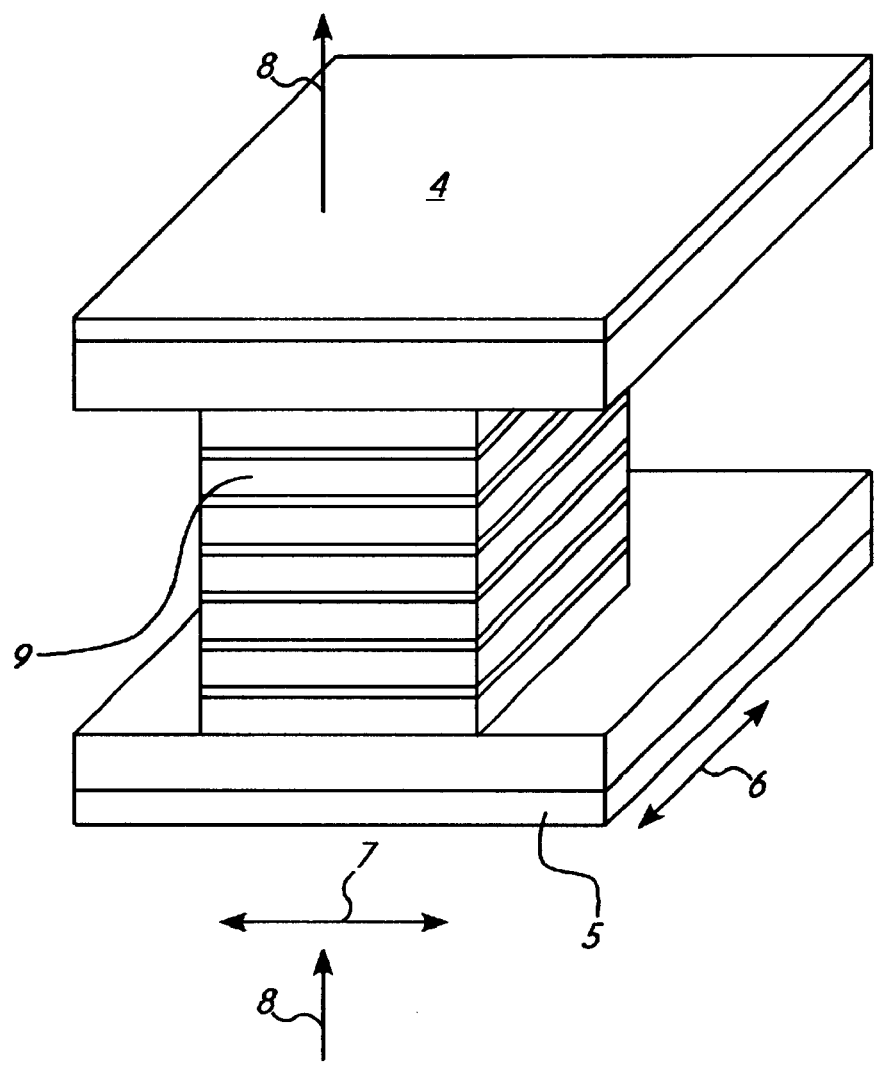
FIG. 2 shows a prior art CPP type sensor.
Figure 3:
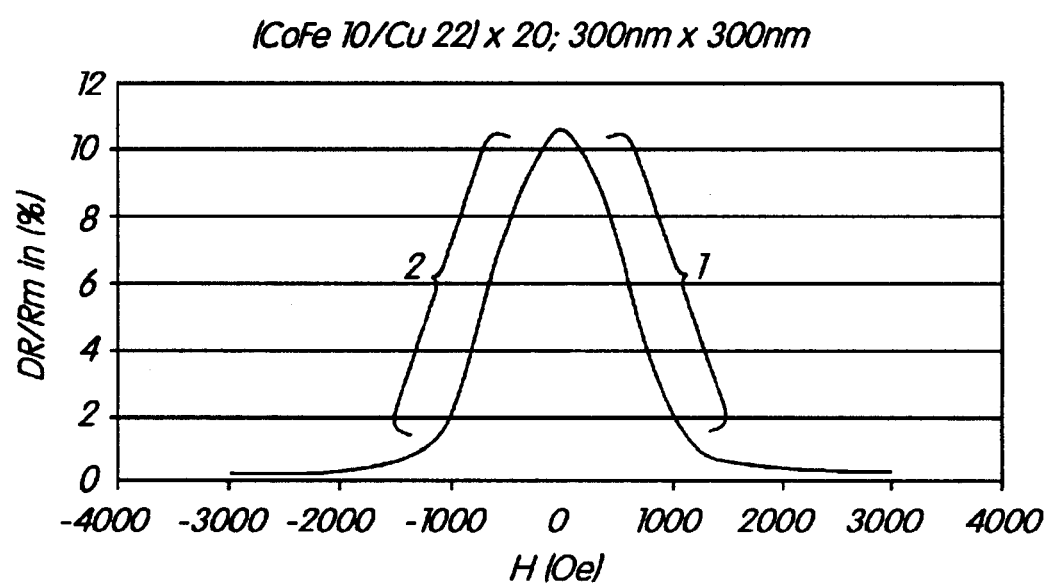
FIG. 3 shows the transfer curve from a CPP-GMR multi-layer.
Figure 4:
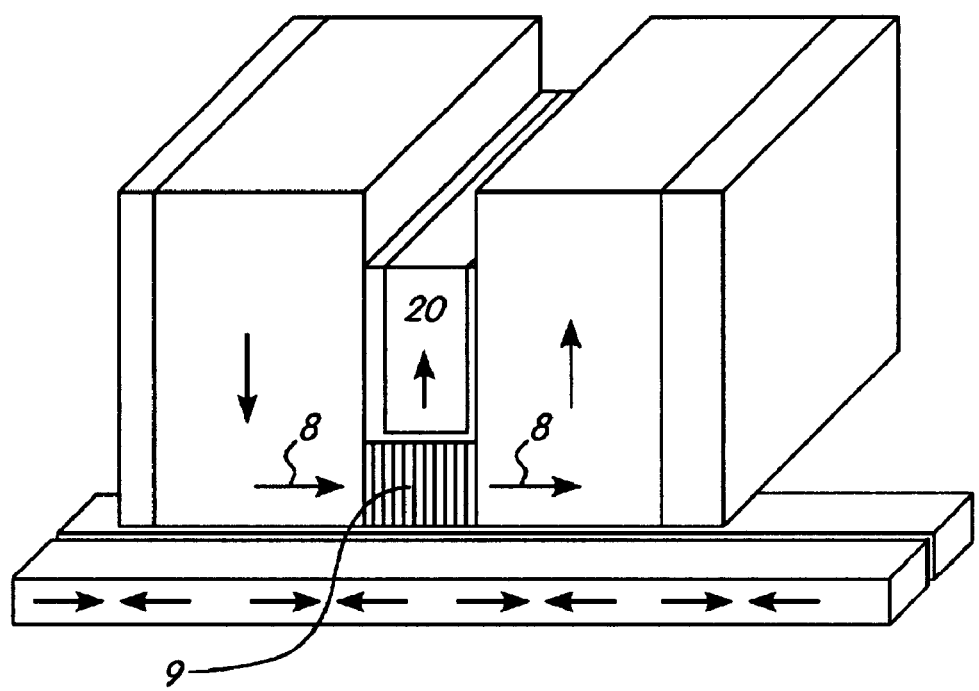
FIG. 4 shows one possible configuration of a GMR multi-layer sensor using a permanent magnet for biasing.
Figure 5:
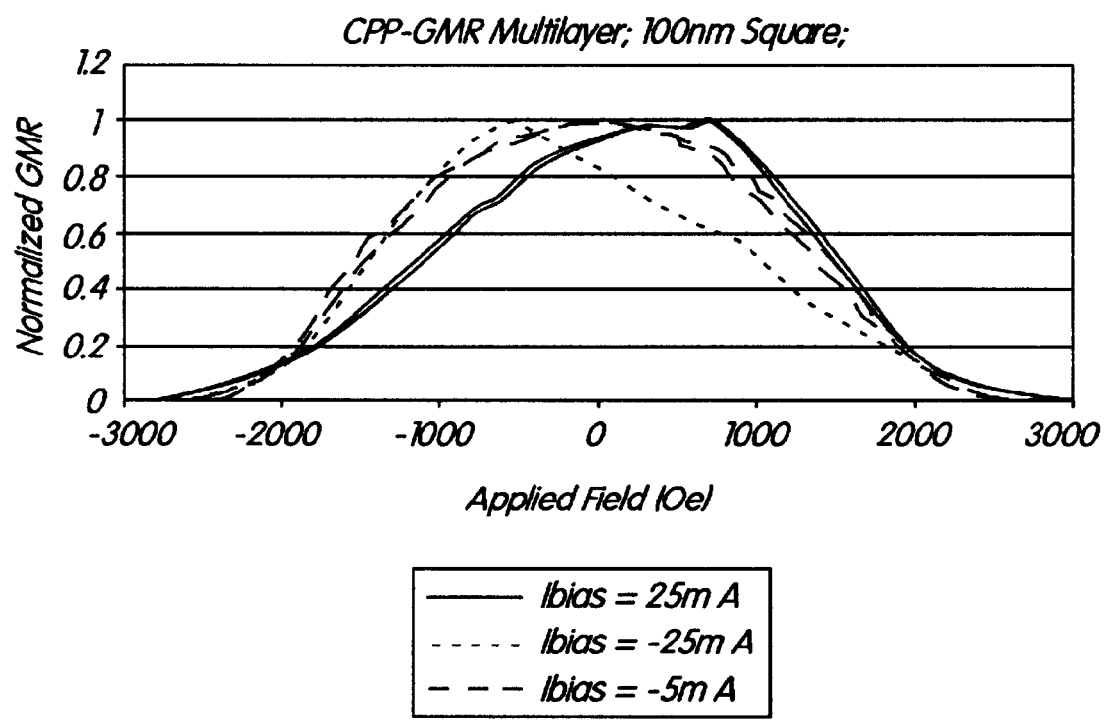
FIG. 5 shows the transfer curve for a CPP-GMR multi-layer with various sense currents passing therethrough.

FIG. 5 shows transfer curves for three different sense currents for a 100 nm square GMR multi-layer configured and operated in the CPP mode, that is, with the sense current flowing perpendicular to each layer of the multi-layer structure. The trace corresponding to a sense current of 5 mA is centered (symmetric) with respect to the applied field. The traces corresponding to a sense current of +/−25 mA are offset with respect to the applied field. The amount of spin-momentum that is transferred from one layer to the next is directly proportional to the current, so it is expected that this offset effect would be more pronounced at high currents but not for low currents.

Figure 6:
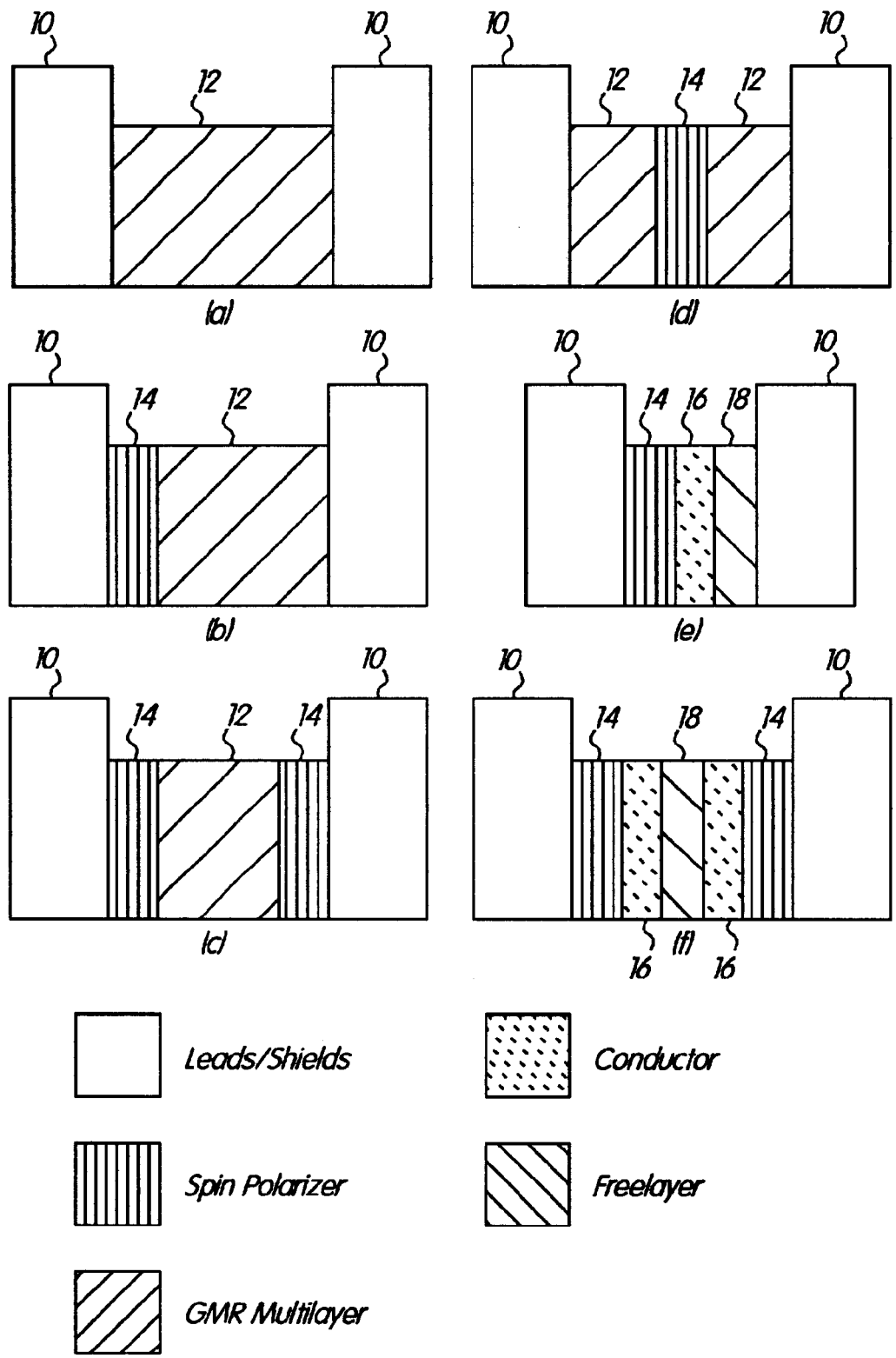
FIG. 6 shows various configurations of sensors contemplated by this invention.

FIGS. 6(a–f) show several different configurations of sensor layouts that will operate according to this invention, taking advantage of the spin-momentum transfer type of sensor biasing. FIG. 6(a) is a simple configuration comprising leads/shields 10 and GMR multi-layer 12, having any number of bi-layers. The sensors of FIGS. 6 (b–d) all utilize GMR multi-layer 12 with a spin polarizing layer or layers 14 somewhere within the sensor. The spin polarization layer could be an FM layer pinned by an AFM layer, a permanent magnet, an FM layer pinned by a permanent magnet or any combination of these. The purpose of the spin polarizing layers is to orient the electrons passing though the polarizer with the same spin to maximize the spin momentum transfer. Spin polarizers may be used on both sides of the device to effect not only transmitted electrons but also electrons which are reflected back into the device. If the spin polarizing layer is chosen and positioned properly, the transmitted electrons could bias the sensor in one direction (up) and the reflected electrons could bias the sensor in the other direction (down) yielding a differential type sensor.

The sensors shown in FIGS. 6(e–f) are extensions of those shown in FIGS. 6(b–c) with only one freelayer 18 that may be de-coupled from the spin polarizing layer or layers 14 via a conductive layer 16. Freelayer 18 is composed of a ferromagnetic material. The configuration shown in FIGS. 6(e–f) operate as simple spin valves. The combination of the spin polarizer and freelayer/conductor combination provides a GMR effect with out a multi-layer GMR structure. Again, spin polarizers may be used on both ends of the device because of the tendency of some electrons to be reflected back into the device.

Many other sensor layouts using this spin-momentum biasing idea are contemplated, all of which would work in a manner similar to those shown in FIGS. 6(a–f) and in accordance with this invention.

It is also contemplated that the adjustable biasing of the sensors could be accomplished in several different ways. One way would be for the biasing to be set at the factory as part of the manufacturing process. A second method would be for circuitry in the unit to detect variations in the biasing and to adjust the biasing dynamically by varying the sense current. Such circuitry could be designed by anyone of ordinary skill in the art.

Several configuration for sensors using the spin momentum transfer theory are presented in FIG. 6. However, the invention is not meant to be limited thereby. The bounds of the invention, captured in the following claims, is meant to encompass any magnetoresistive structure wherein the sense current passes perpendicularly through all layers of the sensor and is used to bias the sensor into a linear operating region of the transfer curve, or wherein the main biasing of the sensor is provided by a permanent magnet in close proximity to the magnetoresistive structure and wherein the sense current is used to fine tune the biasing of the sensor.

What is claimed is:

1. A magnetic sensor comprising:
   one or more GMR multilayer structures comprising a plurality of adjacent bi-layers, said bi-layers comprising a layer of ferromagnetic material and a layer of non-magnetic material, each of said ferromagnetic layers exhibiting a magnetization;
   wherein said sensor is biased using a current flowing through all layers of said plurality of bi-layers in a direction perpendicular to the plane of the layers, thereby causing said magnetizations of said layers of ferromagnetic material to align at an angle of approximately ninety degrees with respect to each other.

2. The sensor of claim 1 further comprising:
   a pair of conductive shields, one of said shields disposed at each end of said plurality of adjacent layers, wherein said current flows from one of said shields to the other of said shields through said plurality of layers.

3. The sensor of claim 1 wherein said current is adjustable.

4. The sensor of claim 3 wherein said current is adjusted during the manufacturing process of said sensor.

5. The sensor of claim 3 further comprising circuitry to detect deviations in said biasing of said sensor and to dynamically adjust said current to correct said deviations.

6. The sensor of claim 1 further comprising a permanent magnet, located in close proximity to said plurality of layers, such that said permanent magnet serves to bias the magnetization of each of said adjacent bi-layers and further wherein said current flowing through said plurality of layers supplements the biasing provided by said permanent magnet.

7. The sensor of claim 1 wherein said GMR multi-layer structure is biased by said current such that the resistance of said GMR multi-layer varies approximately linearly with respect to a sensed magnetic field.

8. The sensor of claim 1 wherein said ferromagnetic material is cobalt or a cobalt alloy and wherein said non-magnetic material is copper or a copper alloy.

9. The sensor of claim 1 further comprising one or more spin polarizers, interspersed with said one or more GMR multilayer structures.

10. The sensor of claim 9 wherein each of said one or more spin polarizers comprises:
a layer of ferromagnetic material; and
an adjacent layer of anti-ferromagnetic material physically coupled to said ferromagnetic material, thereby pinning the magnetization of said ferromagnetic material.

11. The sensor of claim 10 wherein said ferromagnetic material in said spin polarizer is cobalt or a cobalt alloy and wherein said anti-ferromagnetic material is a manganese alloy.

12. The sensor of claim 9 wherein said spin polarizer comprises a permanent magnet.

13. The sensor of claim 9 wherein said spin polarizer comprises a layer of ferromagnetic material in close proximity to a permanent magnet.

14. The sensor of claim 9 wherein said current is adjustable.

15. The sensor of claim 14 wherein said current is adjusted during the manufacturing process of said sensor.

16. The sensor of claim 14 further comprising circuitry to detect deviations in said biasing of said sensor and to dynamically adjust said current to correct said deviations.

17. A magnetic spin valve sensor comprising:
a first layer of ferromagnetic material having a magnetization;
a layer of non-magnetic material adjacent said first layer of ferromagnetic material; and
a second layer of ferromagnetic material having a magnetization adjacent said layer of non-magnetic material;
wherein said magnetization of said first layer of ferromagnetic material is pinned and further wherein said sensor is biased using a current flowing through all of said layers in a direction perpendicular to the plane of said layers, thereby causing said magnetization of said second layer of ferromagnetic material to be biased at an angle of ninety degrees with respect to said magnetization of said first layer of ferromagnetic material.

18. The sensor of claim 17 further comprising:
a permanent magnet in close proximity to said second layer of ferromagnetic material, wherein said current flowing through said plurality of layers serves to supplement a biasing provided by said permanent magnet of said second layer of ferromagnetic material.

19. The sensor of claim 17 wherein said current is adjustable.

20. The sensor of claim 19 wherein said current is adjusted during the manufacturing process of said sensor.

21. The sensor of claim 19 further comprising circuitry to detect deviations in said biasing of said sensor and to dynamically adjust said current to correct said deviations.

22. A magnetic sensor comprising:
a plurality of layers of selected from a group consisting of spin polarizers, conductive layers and freelayers;
wherein said plurality of layers are disposed adjacent each other with said conductors being disposed between said freelayers and said spin polarizers;
said sensor being biased using a current flowing through said all of said layers, in a direction perpendicular to the plane of said layers, thereby causing said magnetization of said freelayers to align at an angle of approximately ninety degrees with respect to said spin polarizers.

23. The sensor of claim 22 further comprising:
a pair of conductive shields, one of said shields disposed at each end of said plurality of adjacent layers, wherein said current flows from one of said shields to the other of said shields through said plurality of layers.

24. The sensor of claim 22 wherein said conductive layers are composed of copper or a copper alloy and wherein said freelayers are composed of cobalt or a cobalt alloy.

25. The sensor of claim 22 wherein each of said one or more spin polarizers comprises:
a layer of ferromagnetic material; and
an adjacent layer of anti-ferromagnetic material physically coupled to said layer of ferromagnetic material, thereby pinning the magnetization of said ferromagnetic material.

26. The sensor of claim 25 wherein said ferromagnetic material is cobalt or a cobalt alloy and wherein said anti-ferromagnetic material is a manganese alloy.

27. The sensor of claim 22 wherein said spin polarizer comprises a permanent magnet.

28. The sensor of claim 22 wherein said spin polarizer comprises a layer of ferromagnetic material in close proximity to a permanent magnet.

29. The sensor of claim 22 wherein said current is adjustable.

30. The sensor of claim 29 wherein said current is adjusted during the manufacturing process of said sensor.

31. The sensor of claim 29 further comprising circuitry to detect deviations in the biasing of said sensor and to dynamically adjust said current to correct said deviations.

32. The sensor of claim 22 further comprising a permanent magnet, located in close proximity to said sensor, such that said permanent magnet serves to bias the magnetization of each of said freelayers and further wherein said current through said plurality of layers supplements the biasing provided by said permanent magnet such that said magnetization of said freelayers is aligned at an angle of approximately ninety degrees with respect to said spin polarizers.

33. The sensor of claim 32 wherein said current is adjustable.

34. The sensor of claim 33 wherein said current is adjusted during the manufacturing process of said sensor.

35. The sensor of claim 33 further comprising circuitry to detect deviation in the biasing of said sensor and to dynamically adjust said current to correct said deviations.

36. A magnetic sensor comprising:
a magnetoresistive multi-layered structure;
wherein said sensor is biased using a current flowing through each of said layers of said multi-layered structure in a direction perpendicular to the plane of said layers.

37. The magnetic sensor of claim 36 wherein some of said layers of said magnetoresistive multi-layered structure are composed of a ferromagnetic materials exhibiting a magnetization, and further wherein said biasing is performed by adjusting said current to cause said magnetizations of said layers of ferromagnetic material to align at an angle of approximately ninety degrees with respect to each other.

38. The sensor of claim 37 wherein said current is adjusted during the manufacturing process of said sensor.

39. The sensor of claim 37 further comprising circuitry to detect deviation in the biasing of said sensor and to dynamically adjust said current to correct said deviations.

40. The magnetic sensor of claim 36 further comprising:
a permanent magnet disposed in close proximity to said magnetoresistive structure;
wherein said sensor is substantially biased by said permanent magnet and wherein said current is adjusted to fine tune the biasing provided by said permanent magnet.

* * * * *